United States Patent [19]

DeKarske et al.

[11] Patent Number: 4,945,512

[45] Date of Patent: Jul. 31, 1990

[54] HIGH-SPEED PARTITIONED SET ASSOCIATIVE CACHE MEMORY

[75] Inventors: Clarence W. DeKarske, St. Paul Park; Aaron C. Peterson, Columbia Heights, both of Minn.

[73] Assignee: Unisys Corporation, Blue Bell, Pa.

[21] Appl. No.: 241,436

[22] Filed: Sep. 7, 1988

[51] Int. Cl.5 .................... G11C 7/00; G11C 29/00; G06F 11/00

[52] U.S. Cl. .................. 365/49; 365/189.01; 365/230.06; 371/10.2

[58] Field of Search ... 364/200 MS File, 900 MS File; 371/10, 13; 365/49, 230.03, 230.06, 189.07, 189.01

[56] References Cited

U.S. PATENT DOCUMENTS

| | | | |
|---|---|---|---|
| 4,168,541 | 9/1979 | DeKarske | 365/49 X |
| 4,641,305 | 2/1987 | Joyce et al. | 371/13 X |
| 4,667,288 | 5/1987 | Keeley et al. | 371/10 X |
| 4,685,082 | 8/1987 | Cheung et al. | 365/49 |
| 4,758,982 | 7/1988 | Price | 365/49 X |
| 4,831,622 | 5/1989 | Porter et al. | 371/10 |

Primary Examiner—Stuart N. Hecker
Assistant Examiner—Alyssa H. Bowler
Attorney, Agent, or Firm—John B. Sowell; Glenn W. Bowen; Robert S. Bramson

[57] ABSTRACT

A high-speed partitioned set associative cache memory is provided with a plurality of cache memory boards. Each of the boards is provided with a partial data array and a full tag array on each board. At least one memory address register is mounted on each of the boards with the partial data array and the full tag array for receiving a unique address from the central processing unit which enables the plurality of memory address registers to simultaneously access addresses in the partial data arrays on different boards and to also address tag addresses associated with the data addresses by sequencing controls mounted on a separate board with logic circuits which monitor output signals from the data arrays and the tag arrays. The output signals resulting from accessing memory locations in the cache memory are coupled to logic circuits for determining the type of error and the exact array where a single error has occurred.

17 Claims, 9 Drawing Sheets

|  | | BLOCKS @ 68 | | | |
|---|---|---|---|---|---|
|  | | A | B | C | D |
| BOARDS | A | 1 | 0 | 0 | 0 |
|  | B | 0 | 0 | 0 | 0 |
|  | C | 1 | 0 | 0 | 0 |
|  | D | 1 | 0 | 0 | 0 |

Fig. 4

|  | | BLOCKS | | | |
|---|---|---|---|---|---|
|  | | A | B | C | D |
| BOARDS | A | 1 | 0 | 0 | 0 |
|  | B | 0 | 1 | 0 | 0 |
|  | C | 1 | 0 | 0 | 0 |
|  | D | 1 | 0 | 0 | 0 |

Fig. 5

|  | | BLOCKS | | | |
|---|---|---|---|---|---|
|  | | A | B | C | D |
| BOARDS | A | 0 | X | X | X |
|  | B | 0 | X | X | X |
|  | C | 1 | X | X | X |
|  | D | 1 | X | X | X |

Fig. 6

|  | | BLOCKS | | | |
|---|---|---|---|---|---|
|  | | A | B | C | D |
| BOARDS | A | 1 | 1 | 1 | 1 |
|  | B | X | X | X | X |
|  | C | X | X | X | X |
|  | D | X | X | X | X |

HIGH-SPEED PARTITIONED SET ASSOCIATIVE CACHE MEMORY

RELATED APPLICATIONS

This Application provides an improvement in the access time to the cache memory shown and described in our U.S. Pat. No. 4,168,541 assigned to the same assignee-successor as the present invention.

BACKGROUND OF THE INVENTION

1. Field of the Invention

The present invention relates to a set associative cache memory of the type organized in blocks and adapted to provide a high-speed buffer between plural accessing units and a relatively low speed main memory of a CPU. More particularly, the present invention relates to a novel circuit arrangement and error control monitoring circuitry for accessing memory addresses in a high-speed cache memory.

2. Description of the Prior Art

The purpose of a set associative cache memory is to provide a high-speed buffer to serve as a temporary memory between the low speed main memory and requesting unit or units which have access to the processing system. Our aforementioned U.S. Pat. No. 4,168,541 describes what was then called a high-speed set associate cache memory. The cache memory of this prior art patent was designed approximately ten years ago and has been employed in commercially available computers sold by Unisys (formerly Sperry) as models 1100/80 and 1100/90 high-speed computers. The data array cache memory employed in this prior art patent describes a cache memory for storing 512 sets of four words each arranged in four blocks, each representing one-quarter of the cache memory. Each of the four blocks were arranged on a separate circuit board or mother board. The cache memory disclosed in this prior art patent provided a total capacity of 8K full words or 32K quarter words. The full words comprised thirty-six data bits and four parity bits which were composed of one quarter of a full word from each of the four blocks.

The present invention partitions its cache memory in a similar manner but comprises 32K full words of forty bits stored in RAM memory chips. The size of the memory of the present invention is four times that of the prior art cache memory. It is well known that the access time for a unique address in memory increases with the size of the memory. Thus, if the circuit arrangement of the prior art cache memory is linearly expanded, the access time for an address in memory would logically be increased. While it is possible to increase the switching time of the logic gate circuits, it is not possible to decrease the data array access time lower than the 14 to 15 nanoseconds presently required.

Accordingly, there is a current need for a set associative cache memory having larger capacity and faster access times than those provided in the prior art cache memories.

SUMMARY OF THE INVENTION

The primary object of the present invention is to provide a set associative cache memory having enhanced access speed.

Another primary object of the present invention is to provide a novel circuit arrangement and error control circuitry for monitoring errors generated by accessing memory addresses in a high-speed cache memory.

It is another primary object of the present invention to provide logic circuitry for monitoring errors generated when accessing memory addresses in a cache memory and for determining the error status of the memory address.

It is another primary object of the present invention to provide circuit means for identifying the type of error that occurs when accessing cache memory addresses and for indicating the board or substrate on which the error occurs.

It is another object of the present invention to provide circuit means for identifying data array parity errors and tag array parity errors.

It is another object of the present invention to provide a plurality of novel cache memory circuit packages which contain quarter words of full data words and a full copy of the tag array.

It is yet another object of the present invention to provide a novel circuit logic package which monitors a plurality of cache memory circuit packages and determines error and status.

According to these and other objects of the present invention, there is provided a high-speed partitioned set associative cache memory which comprises a plurality of cache memory boards, each of said boards having a partial data array mounted on each board and a full tag array mounted on each board with the partial data array. A memory address register is mounted on each of the boards with the partial data array and the full tag array for receiving a unique address from the CPU and for simultaneously accessing addresses on said partial data array boards and said full tag arrays. There is further provided logic circuit and control means mounted on a separated board from said plurality of individual partial data array boards for monitoring data array errors and tag array errors resulting from accessing memory locations in said cache memory and for identifying the exact array where an error has occurred.

DESCRIPTION OF THE PREFERRED EMBODIMENT

Figure 1:
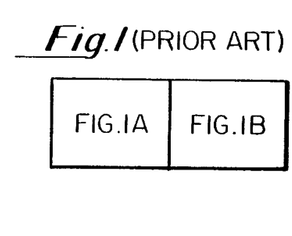
FIGS. 1A and 1B is a simplified block diagram of a prior art high-speed set associative cache memory.
Figure 1A:
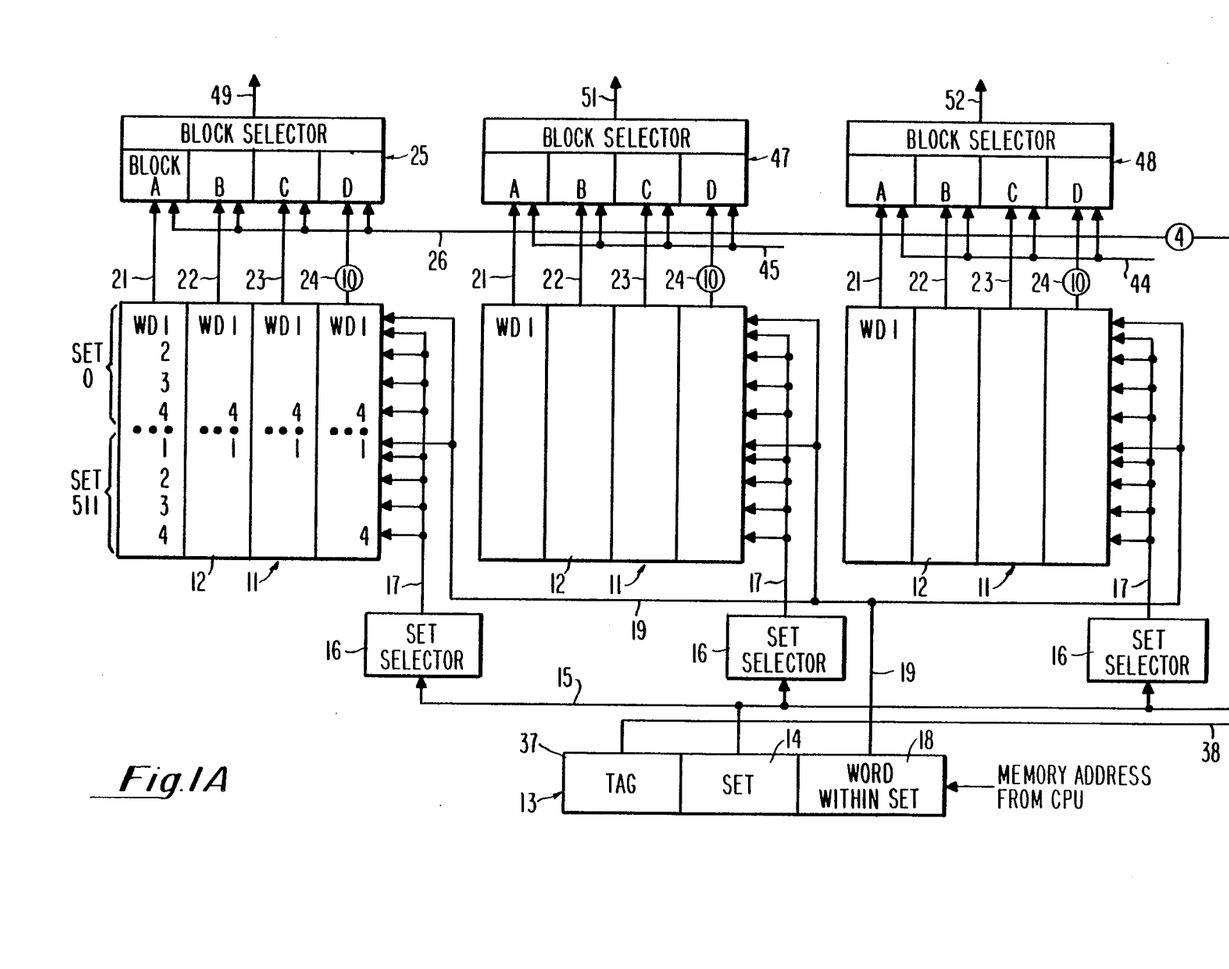
Figure 1B:
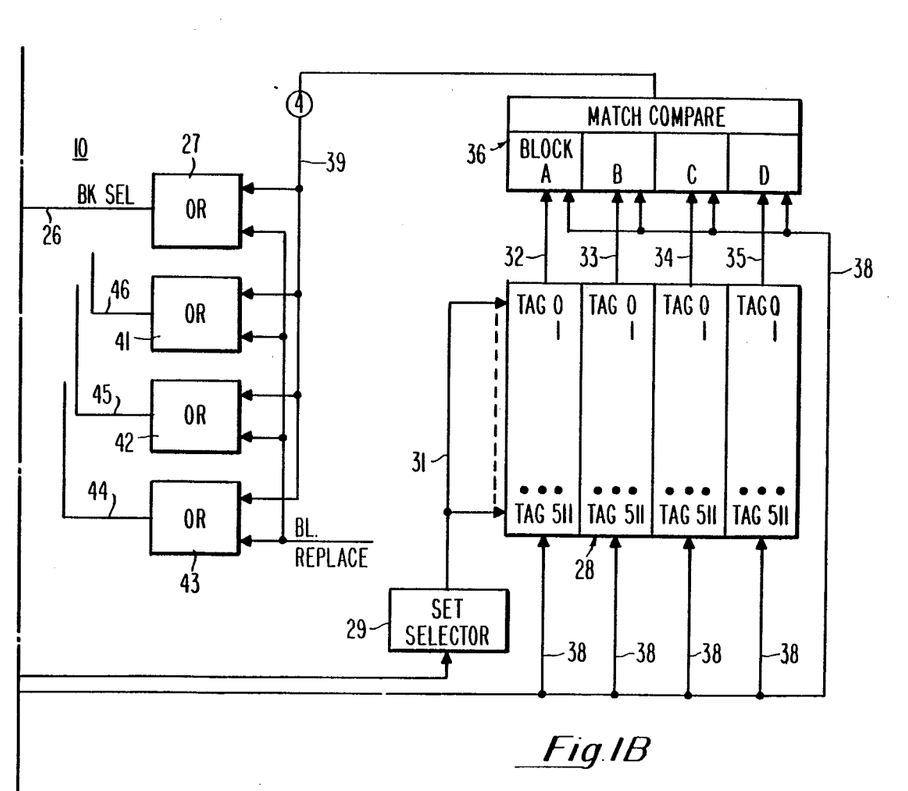

Refer now to FIG. 1 showing a simplified block diagram of the prior art cache memory shown in our U.S. Pat. No. 4,168,541. The cache memory 10 comprises a data array 11 comprising four boards 12. Each board 12 is partitioned into four blocks shown as blocks A, B, C and D. The data array 11 comprises four data array boards 12. each of which provides the memory for one quarter of one full word. A full word of 36 data bits and four parity bits is partitioned accross four data array boards 12. In this prior art cache memory, each of the blocks A to D on each of the data array boards 12 is shown having four one quarter length words in each of the 512 sets. When a memory address arrives in the address register 13, the set address portion 14 is presented on line 15 to the word set selectors 16 to provide a set address on line 17 that identifies one of the 512 sets of four quarter words. The word portion 18 of the memory address register 13 provides an address on line 19 which identifies one of the four quarter words in one of the 512 sets. Since each of the partial word data array boards 12 operates in the same manner to provide a full word, the description which follows will be applicable to all four of the quarter word data array boards 12. The addresses on lines 17 and 19 access a memory location on board 12 to provide four different quarter words on lines 21 to 24 from the quarter word data array boards 12. It will be understood that only one of these quarter words is the correct and desirable quarter word supplied to the block selector 25. The block selection signal occurs on line 26 to the blocks A to D in the block selector 25. The block select signal from OR gate 27 is generated initially by the tag array 28 which is partitioned in a manner similar to the quarter word data array boards 12. The tag array 28 is shown having 512 tag addresses for each of the 512 sets of four words arranged in four blocks. The set address on line 15 is applied to a set selector 29 which provides the set address on line 31 to the tag array 28. The address on line 31 to tag array 28 produces output tag addresses on lines 32 to 35 to blocks A to D of the match comparator 36. The tag portion 37 of the address register 13 produces a tag address on line 38 which is also applied to the blocks A to D of match comparator 36 to select the block match of the tag address from lines 32 to 35 with the address on line 38 and to produce a select signal on line 39 which selects or identifies one of the four OR gates 27, 41, 42 and 43 associated with the four quarter word data arrays 12. It will be understood that OR gate driver 27 produces a signal on line 26 which selects one of the four blocks A to D of the left most quarter word data array 12. In a similar manner OR gate 43 produces a signal similar to the signal on line 26 on its output driver line 44 which selects one of the blocks A to D in the right most quarter word data array 12. In similar manner, the OR gate driver 42 produces a signal on line 45 which selects the same block in the third quarter word data array 12 shown as 3 of 3. The output line 46 from OR gate 41 is shown terminated because the second of four quarter word data array boards 12 is not shown.

The tag address on line 38 is shown connected to each of the blocks A to D of the tag array 28 and is used for identifying the block of the tag array in comparator 36 and storing the tag portion of the memory address in the tag array during block replacement. The block selectors 25, 47 and 48 each select the same block but different quarter words from the quarter word data arrays 12 and provide one word bytes comprising 10 bits on the output lines 49, 51 and 52.

The compare signal on line 39 indicates that there was a match between the current tag address produced at portion 37 of the address register 13 and one of the entries to the tag array 28, thus, confirming that there is a valid match comparison. The full data word on lines 49, 51, 52 etc. is the data word from the correct address but must now be parity checked to determine if a single bit error has occurred in accessing the cache memory 10.

The prior art cache memory shown in FIG. 1 provided 8K forty bit words of memory which were arranged on four boards shown as quarter word data array boards 12 and further required a fifth logic board that contains the tag array 28 and an additional board for the cache control logic. If the cache array 11 is to be expanded by a factor of 4 the number of set addresses to produce the additional words of the same length would be increased by a factor of 4. Using the same technology, it would require longer access times to access the additional memory locations.

Figure 2:
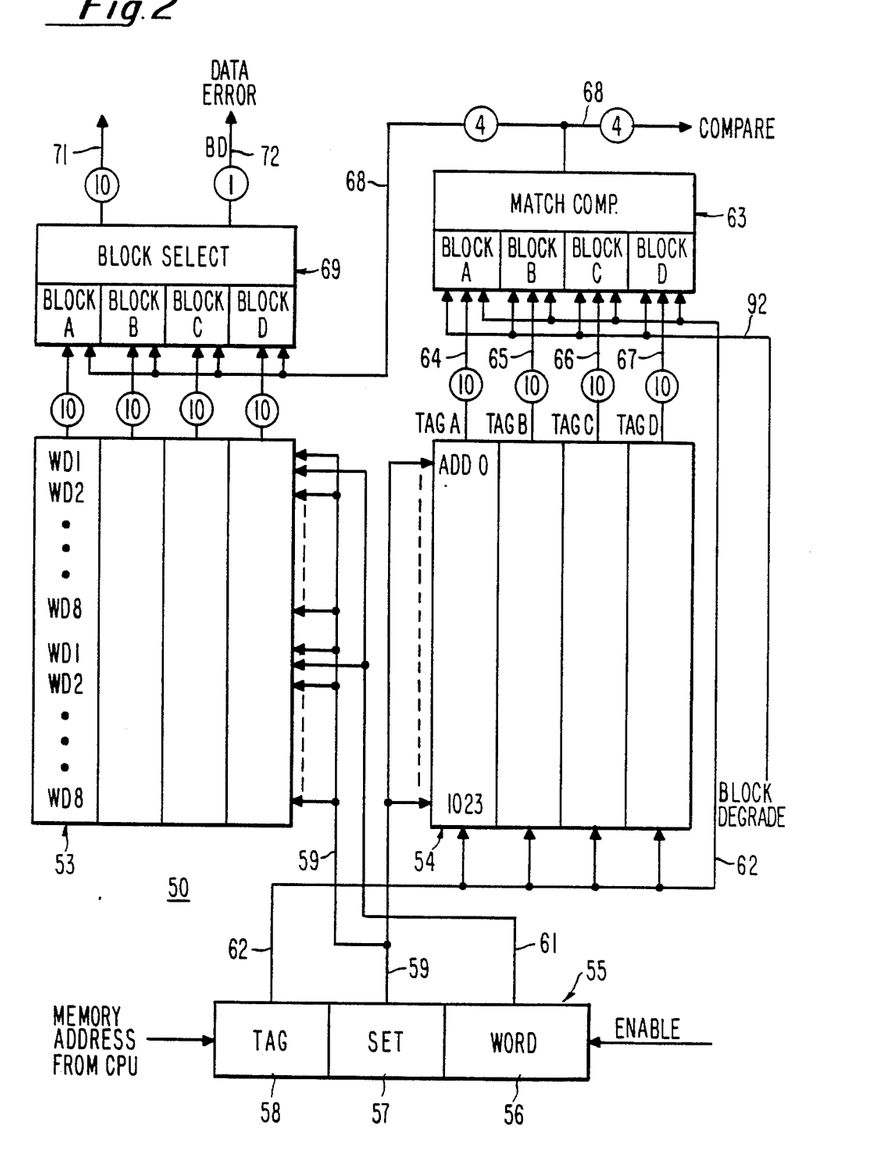
FIG. 2 is a simplified block diagram of one of the packages of the present embodiment set associative cache memory which achieves faster access speed.

Refer now to FIG. 2 showing a simplified block diagram of one of the present inventions data array boards 50. The novel data array board 50 comprises a quarter word data array 53 mounted on the same board with a full tag array 54. In addition, the memory address register 55, which is shown as a single register, is mounted on the same board with the data array 53 and the tag array 54. As will be explained in greater detail hereinafter, the speed of access is improved by providing a plurality of memory address registers 55 associated with a plurality of memory chips on a module within the data array 53. The CPU provides the memory address in the memory address register 55 divided into word, set and tag portions 56, 57 and 58. The set portion of the address on line 59 and the word portion of the address on line 61 identifies the one word of the 1024 sets of eight words across the four blocks A to D which comprise a quarter word of a full word in the data array 53. Also, the set address on line 59 is shown coupled to the tag array 54 for identifying the one unique tag address of the 1024 tag addresses across the four blocks A to D of the tag array 54. The tag portion of the memory address on line 62 is stored in the blocks A to D as explained hereinbefore and is applied to the match comparator 63 so that the address is compared with the output from the tag array 54 to verify that a tag comparison of an address on one of lines 64 to 67 exist. The tag compare signal on line 68 identifies the one block A to D of the tag array having the address which matches the address on line 62 and properly identifies the block in which the quarter word of data information in the quarter word data array 53 exists. Line 68 is connected to the block selector 69 for selecting the proper block A to D and the proper quarter word which is presented on output line 71 to the CPU (not shown).

The present invention is being explained employing eight quarter words per block set where there are 1024 sets and four blocks of quarter words for each quarter word data array. Each quarter word data array shown in FIG. 2 has its own full tag array 54 associated therewith and its own memory address register 55, or a plurality of copies of the memory address 55 on each of the data array boards preferably mounted in close proximity to modules of memory chips. It will be understood that each quarter word data array 53 is associated with its own board and has 32K quarter words stored therein. When four such data array boards 50 are provided a complete cache memory data array comprising 32K full words of 36 data bits and four parity bits is provided. Each of the four data array boards 50 of the cache memory produces at its output line 72 a parity error for the selected block A, B, C or D and also produces four tag compare signals on line 68 of which only one is a high signal indicative of a match compare in the address selected block A, B, C or D and block not degraded on line 92. The signals on lines 72 and 68 are applied to the novel monitoring and error detection circuits which will be explained in detail hereinafter. Before explaining the logic circuits, the type of errors which can be detected are best explained with reference to truth table shown in FIGS. 3 to 6.

Figure 3:
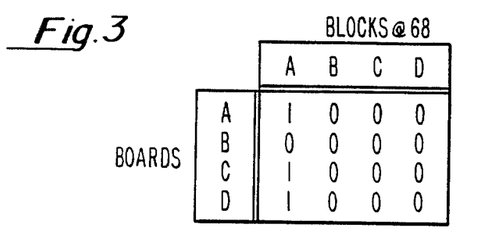
FIG. 3 is a truth table showing a one bit block error which has occurred on one of the packages of boards of the type shown in FIG. 2.

Refer now to FIG. 3 showing a truth table for a one bit block error. The ordinate is representative of the four boards 50 which could be designated boards 50-1 to 50-4 but are here represented as boards A, B, C and D for boards 1, 2, 3 and 4. The abscissa is representative of the match compare signals being produced on line 68 representative of the tag match compare conditions. The column under block A shows that boards A, C, and D (representative of boards 1, 3 and 4) are the same and had a proper match and that board B (the 2nd board) did not have a proper tag address match. This truth table indicates that the tag array 54 has a failure on the second board in block A where the "0" does not compare with the 1's.

Figure 4:
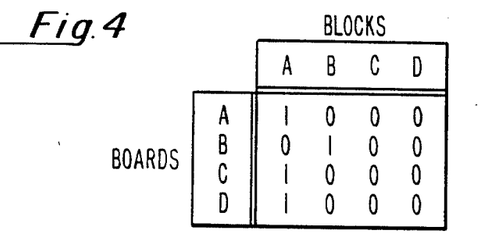
FIG. 4 is a truth table showing a two bit error which has occurred in two of the blocks on one of the boards of the package of boards of the type shown in FIG. 2.

Refer now to FIG. 4 showing a two bit error in two blocks on the same board. The column under block A shows the same error condition as shown in FIG. 3 indicative of an error on the second board in block A. The "1" in the column under block B indicates that the second board (board B) again has an error, but this time it has occurred in block B of the tag array 54. There are two single errors in two different blocks of the same board of FIG. 4.

Figure 5:
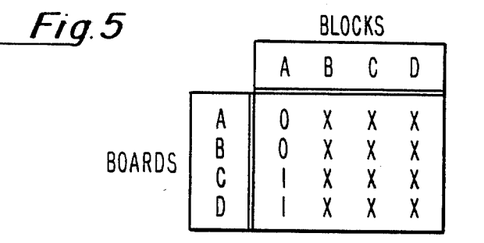
FIG. 5 is a truth table showing two bit errors which have occurred on two different boards of the same same block.

Refer now to FIG. 5 showing two bit errors on two different boards of the same block. The zeros and ones are representative of high and low conditions and the X indicates a don't care condition. Thus, in the vertical column under block A, the two boards A and B are shown having a condition exactly opposite the two boards C and D, which indicates that two of the boards have errors. The conditions under the vertical columns blocks B, C and D are indicated as X or don't care conditions because the conditions are all the same either zeros or ones. Any one of the boards A, B, C and D may be replaced with a good board and will properly identify which of the two boards are bad, because the new information resolves the majority vote.

Figure 6:
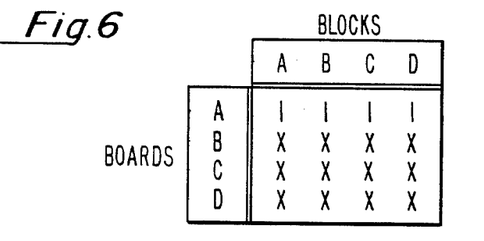
FIG. 6 is a truth table showing a plurality of bit errors which have occurred on the same board but in different blocks.

Refer now to FIG. 6 showing a plurality of bit errors in a plurality of blocks of the same board. The row opposite board A having four ones indicates that a hit or tag address match occurred in all four blocks of the same board and indicates an error condition. Not only is there an error condition but it exists in three of the blocks and the only way to determine which of the blocks is in error is to replace the whole board A.

Having briefly explained FIGS. 3 to 6, it will be understood that the information represented in these truth tables may be stored in a memory error indicator, where the information can be employed to indicate the exact board and the block in which an error has occurred and preventive maintenance can be performed in the minimum amount of time. Another feature of the present invention which has already been performed in the prior art is that the same information can be used to automatically degrade the cache memory. Degrading automatically disables that portion of the data array board which has the block error.

Access time for the data array 50 can be generally described as the longest time which occurs after loading the memory address register 55 until the data is produced on output line 71. By moving the memory address register 55 into close proximity to the modules and chips used in the quarter word data array 53 and into close proximity to the tag array 54, and by placing the output of match compare circuit 63 of the tag array 54 on line 68 into close proximity to the block select logic 69, the path delay and the logics delays are reduced in overall time even though the cache memory data array has been expanded by a factor of four over the prior art.

Figure 7:
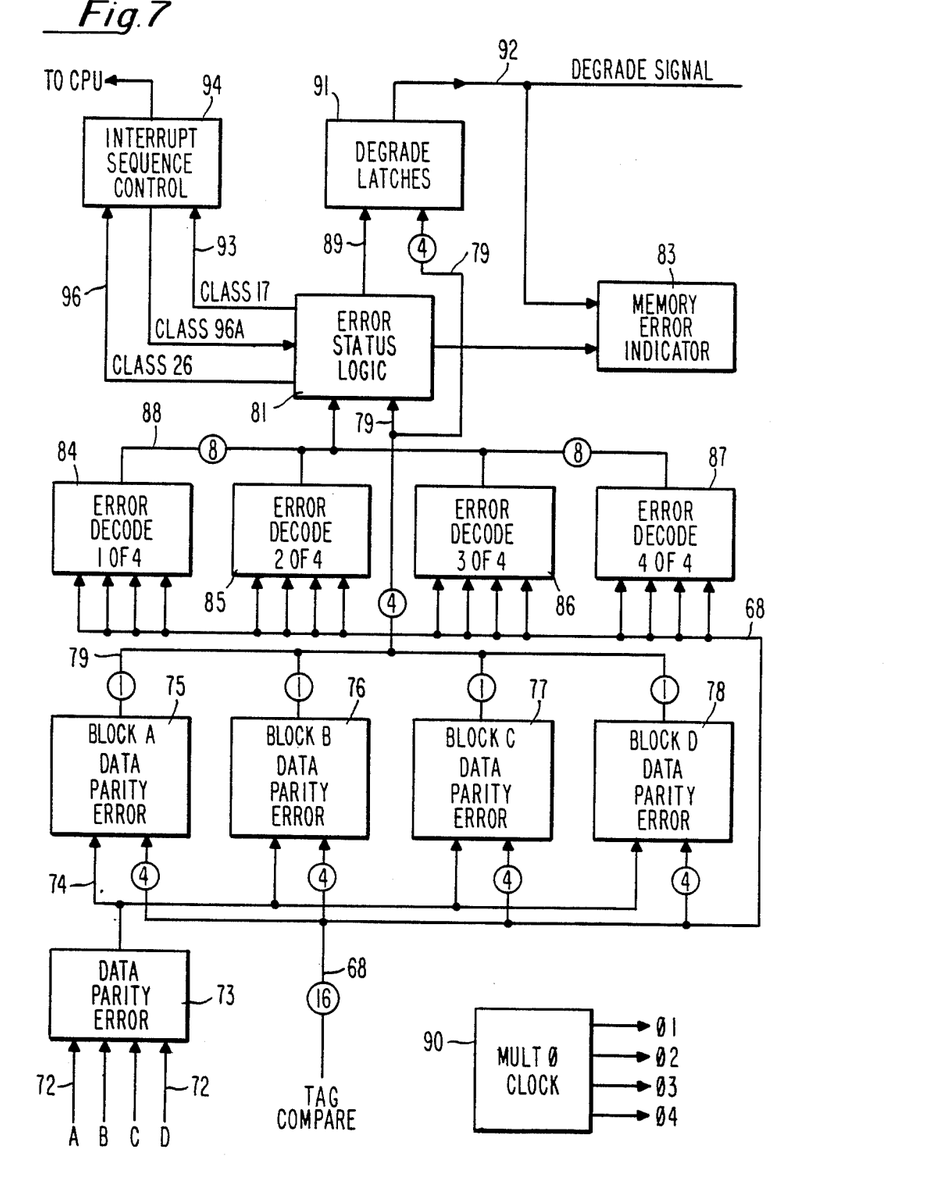
FIG. 7 is a detailed block diagram showing the novel monitoring and error detection circuitry and control logic of the present invention cache memory.

Refer now to FIG. 7 showing the novel monitoring and error detecting circuits and the control logic for the present invention cache memory. The only signals required for monitoring and error detecting circuits from FIG. 2 are the inputs from line 68 and 72 of FIG. 2. The four inputs designated 72 to the data parity error block 73 are from the four boards 50, each of which comprises a quarter word data array 53. The data parity error output signal on line 74 is a data signal indicating at least one parity error. The enable signal to the data parity error blocks 75 to 78 is a unique signal comprising one tag match from each of the four blocks A, B, C, and D. The match signal becomes the enable signal for selecting one of the unique blocks 75 to 78 which is to be degraded. A unique output signal on line 79 is indicative of one of the four blocks 75 to 78 to be degraded by the signal which is applied to error status logic block 81. A data parity error signal on line 79 is indicative of incorrect data output from the data array 50 or an incorrect parity check, either of which should create an immediate degrade and a subsequent class 1 interrupt. The information supplied to the error status logic block 81 produces an error status logic word on line 82 which is stored in the main memory 83 during the interrupt sequence as an error status. The status data stored at memory store 83 indicates the type of error and location of the error. This information can be used after interrupt shut down to enable the system software and maintenance crews to immediately replace the board having the error or enable the executive software to recover from the error.

The same tag comparison signals on line 68 are shown being applied to the error decode logic blocks 84 to 87, which will be explained in greater detail hereinafter. The error decode logic signals from error decode blocks 84 to 87 produces error signals on line 88 which enable the error status logic block 81 to indicate the tag error as well as the block and board location of the tag error. This information on line 88 is supplied to error status logic 81 and can also be stored in the memory status storage block 83 for future use. The block tag error signal on line 89 is applied to the degrade latches 91 along with the selected block parity error signal on line 79. The information in degrade latches 91 is employed to generate a degrade signal on line 92 which identifies the block of information in the cache memory data array 50 which is to be degraded. Thus, one quarter of the information in each of the data array boards may be blocked from access by the computer as will be explained in greater detail hereinafter. The degrade signal on line 92 is also applied to the main storage status memory block 83.

The error status logic 81 produces two types of class 1 error signals on line 93 for identifying a tag error with a no miss condition and/or a data parity error which is a type of error that will cause the interrupt sequence control 94 to inform the CPU (not shown) on line 95 to shut down. However, a tag error with a miss condition will produce a class 26 interrupt signal on line 96 which permits the computer to be degraded and continue operation. For this purpose, line 96 is shown as a bi-directional line so that the clear signal generated by the interrupt sequence control 94 can be applied to the error status logic 81 to clear the error capture latches as will be explained in detail hereinafter. Multi phase clock 90 provides phases of the system clock for sequencing the logic operations. It is a feature of the present invention that the degrade signal on line 92 can also be applied to a paired least recently used (PLRU) replacement system of the type shown in detail in FIG. 1B of U.S. Pat. No. 4,168,541. This degrade system prevents the cache control of the CPU from using the degraded block.

Figure 8:
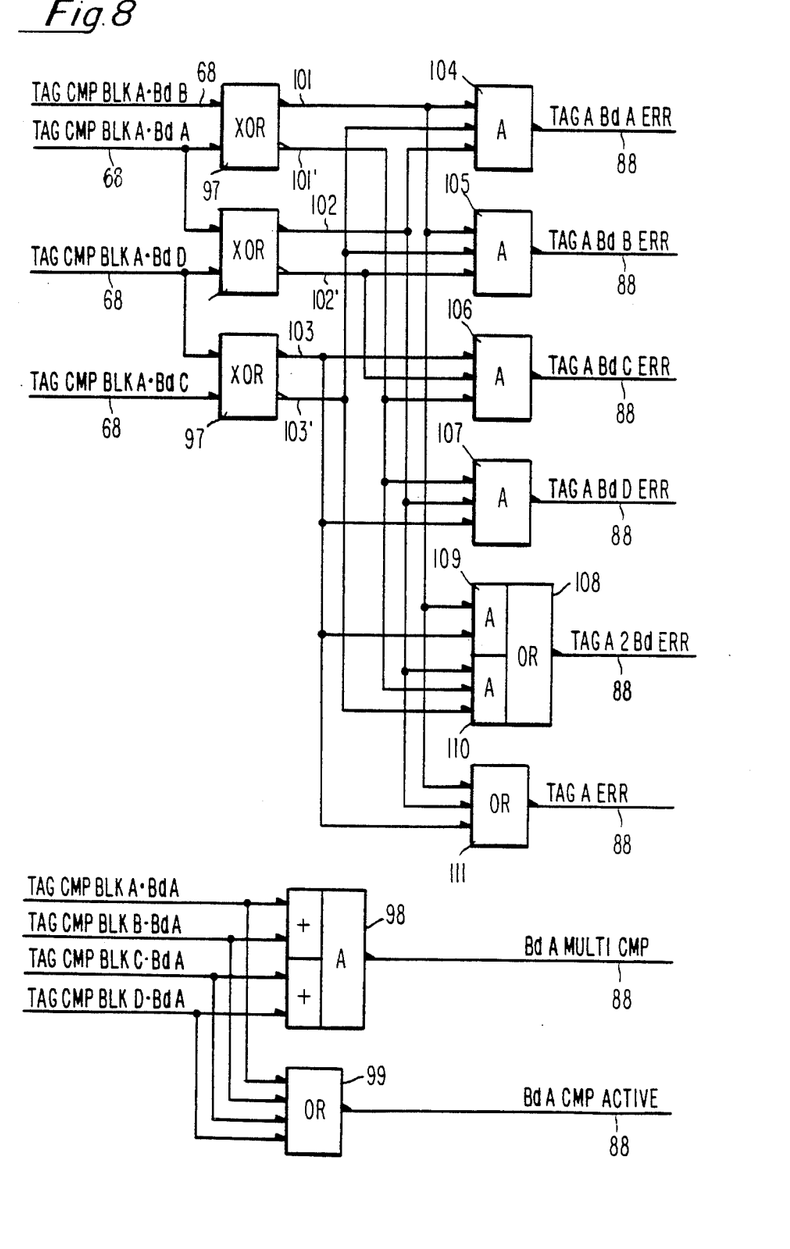
FIG. 8 is a detailed block diagram of the error decoding logic for monitoring tag compare signals.

Refer now to FIG. 8 showing a detailed block diagram of the error decoding logic 84 shown in FIG. 7. The four tag compare signals from each of the match compare blocks 63 on line 68 are shown being applied to exclusive OR gates 97 to AND gate 98 and to OR gate 99. It will be understood that four such error decode logic circuits will be provided and the inputs to the gates 97 to 99 will be changed for each of the four boards as follows: In the board shown in FIG. 8, the tag compare block A (etc.) signal will be changed to block B, block C and block D for each of the remaining three boards as inputs to the exclusive OR gates 97. Similarly, the tag compare block A, B, C and D (Bd A) signals from board A will be changed to blocks A, B, C and D (boards B, C and D) in the subsequent error decoding logic circuit.

The miscompare signal on line 101 from exclusive OR gate 97 is indicative of a miscompare from the two inputs noted. Similarly, the miscompare signals on lines 102 and 103 are indicative of a miscompare from the two input signals noted on their exclusive OR gates 97. The miscompare and NOT miscompare signals on lines 102 to 103 and 102' to 103' are applied to gates 104 to 111 to produce the eight types of error status signals noted which are applied via lines 88 to error status logic block 81. FIG. 8 is representative of one of the four error decoding logic blocks 84 to 87 which are decoding the tag compare signals and producing the error condition output signals on line 88 due to miscompares. The second module or circuit 85 would produce tag B error signals or board B tag compare signals on their lines 88 and subsequent modules would have outputs associated with tag C and D. The type of error signals indicated on lines 88 are produced for each of the four error decode blocks 84 to 87 shown in FIG. 7, thus, produce 32 inputs to the error status logic 81.

Figures 9, 9B:
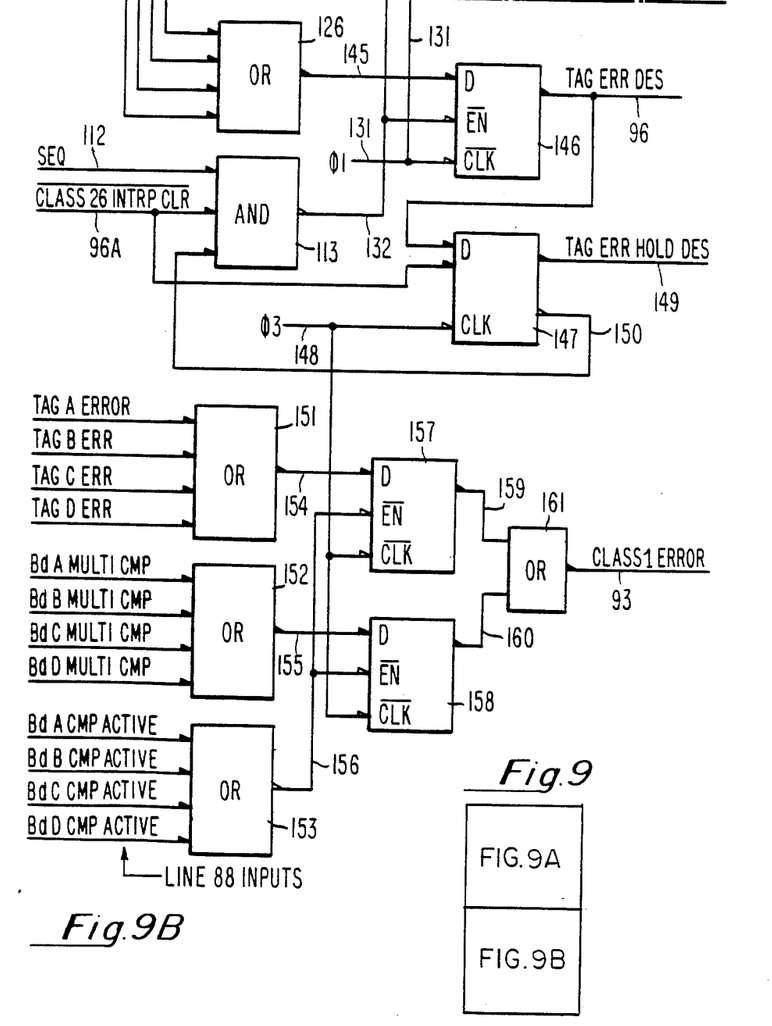
FIG. 9A and 9B is a detailed block diagram of the error status logic for identifying the failed tag arrays and the board on which the failed tag array resides.
Figure 9A:
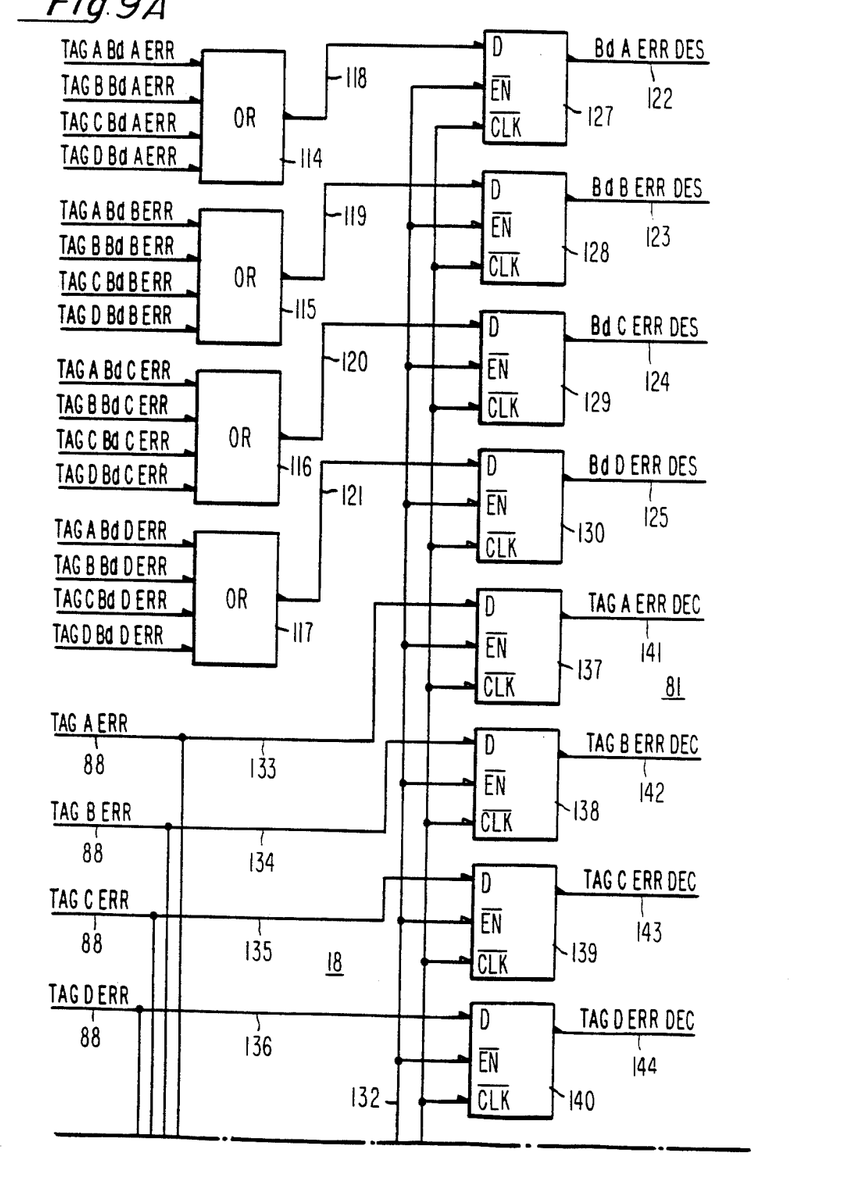

Refer now to FIG. 9 showing a detailed block diagram of the error status logic 81 shown in FIG. 7 which receives the 32 inputs from the error decode logic 84 to 87 in addition to two additional inputs shown as the class 26 input on line 96A and the sequencing (SEQ) input on line 112 to AND gate 113.

Four of the 32 unique signals from the output of error decode logic blocks 84 to 87 are applied to each of the OR gates 114 to 117 to produce unique error signals on lines 118 to 121 indicative of error signals occurring on boards A to D as shown on lines 122 to 125. The board error signals are stored or held in latches 127 to 130. Latches 127 to 130 also have, in addition to their data (D) input, inputs designated as clock and enable signals at their respective clock (CLK) and enable (EN) inputs which are produced by the phase one ($\emptyset 1$) clock on line 131 and the clock enable signal from the output of AND gate 113.

Four of the 32 unique error decode signals on lines 88 are shown being connected to lines 133 to 136 as data inputs to latches 137 to 140 to produce unique error signals on output lines 141 to 144 indicative of the four possible tag error status signals. The aforementioned block error status signals on lines 122 to 125 in addition to the tag error status signals on lines 141 to 144 are applied via lines 82 to the main storage status block 83 in FIG. 7.

The tag error condition from OR gate 126 on line 145 is applied to latch 146 to produce the aforementioned class 26 tag error designation on line 96 from error status logic 81. The signal on line 96 is also applied to the data input of latch 147 along with a phase 3 ($\emptyset 3$) clock input on line 148 to produce a tag error hold signal on line 149. The inverted tag error hold signal output on line 150 is applied as a blocking input to AND gate 113.

Four of the last 12 of the 32 unique inputs on the right-most lines 88 are applied to OR gate 151 to produce an error signal on line 154. Four are applied to OR gate 152 to produce an error signal on line 155 and the last four are applied to AND gate 153 to produce a clock enable signal on line 156 indicative of a tag error with a NOT miss condition. The output of OR gate 151 on line 154 is applied to latch 157 and the output of OR gate 152 on line 155 is applied to latch 158 to produce multi hit error signals on lines 159 and 160 which are applied to OR gate 161 to produce the aforementioned class one error signal on line 93. All of the outputs shown at the top of FIG. 9 are outputs from the error status logic block 81 and are applied via aforementioned lines 82 to the main storage status block 83 to enable hardware and software maintenance personnel to access the information in block 83 and to make proper maintenance and/or corrective steps.

Figure 10:
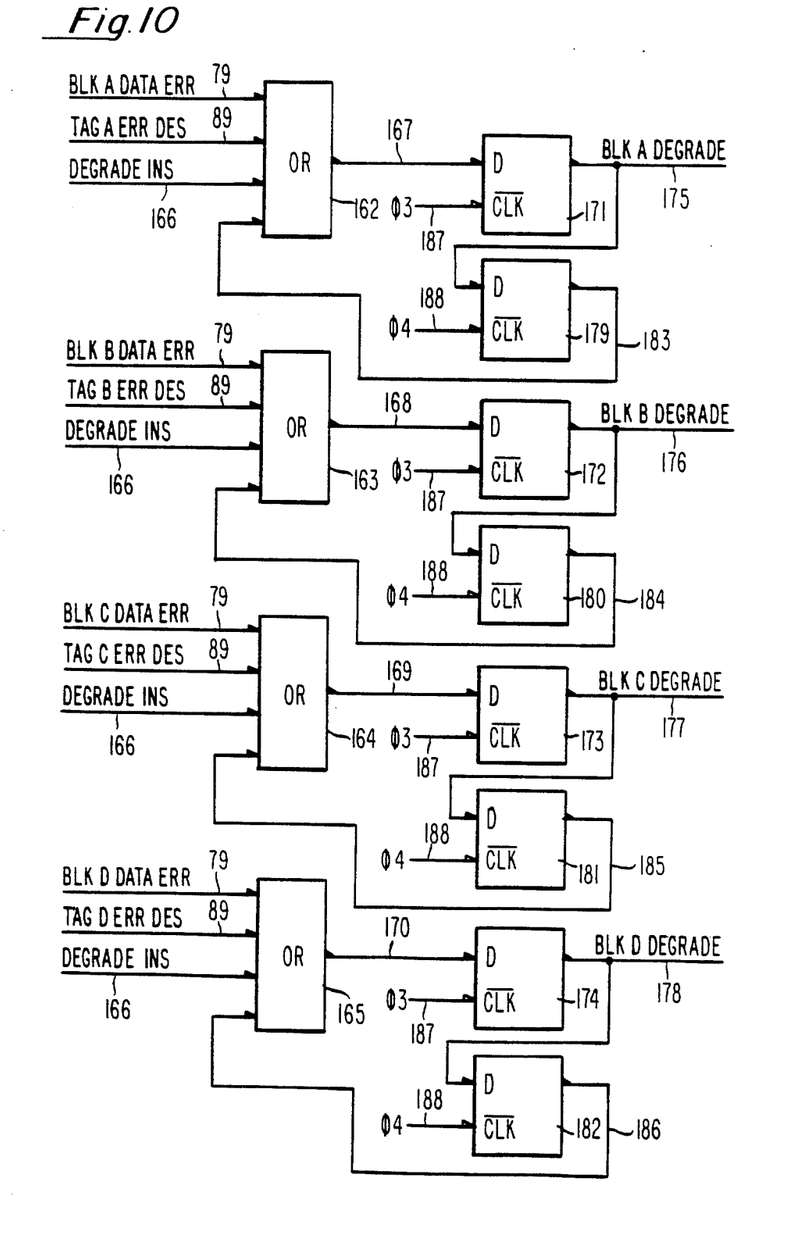
FIG. 10 is a detailed block diagram of the degrade logic for identifying the block on which the failure occurs and the failing block to be degraded.

Refer now to FIG. 10 showing a detailed block diagram of the degrade logic 91 used to identify the failing block to be degraded. Lines 79 and 89 shown on FIG. 7 are shown applied to OR gates 162 to 165 along with a degrade instruction on line 166 which is indicative of a degrade signal generated by conditions other than the signal on line 92 of FIG. 7. Other sources of degrade signals on lines 166 may include real tag errors as well as other maintenance conditions..Accordingly, the output on lines 167 to 170 from OR gates 162 to 165 are signals indicative of the blocks A to D to be degraded. The block degrade signals on lines 167 to 170 are applied to latches 171 to 174 to hold the block degrade signal on lines 175 to 178 that form signal 92 in FIG. 7. The hold block degrade signals on lines 175 to 178 are applied as data inputs to latches 179 to 182 to produce a replica of the signal on lines 175 to 178 on lines 183 to 186. The replica signals on lines 183 to 186 are applied to the data inputs of the OR gates 162 to 165 to lock up the degrade latches 171 to 174 so that the degrade signals on lines 175 to 178 are not lost. A phase 3 ($\emptyset 3$) clock on line 187 and a phase 4 ($\emptyset 4$) clock on line 188 are shown applied to the pairs of latches employed to lock up the degrade signal.

Having explained how the logic circuits for the error decode blocks 84 to 87 are implemented in FIG. 8 and how the error status logic block 81 is implemented in FIG. 9 and how the degrade latches logic in block 91 is implemented in FIG. 10, it will be appreciated that the logic signals from input to output of these logic blocks are produced during the same cycle time at different phases of the same clock. Cycle time of a minor cycle is about 15 nanoseconds and has four phases separated by 3.75 nanoseconds. For example, with reference to FIG. 2, assume that the address register 55 shown is the address register associated with the tag array 54 only, and a similar address register 55 is associated with the data array 53. By loading the address for the tag array during a phase 1 operation and loading the address for the quarter word data array 53 during a phase 2 operation, the block select circuit 69 and the match compare circuit 63 are operated during a phase 3 operation producing the tag compare information on line 68 and the parity error information on line 72. The 10 bit information on line 71 from each of the quarter word data arrays is avilable after the phase 3 block select operation is complete. The fact that the data parity error and the tag compare error information is routed to the FIG. 7 monitoring an error detection circuit for subsequent decision does not impair or delay the normal access time of the novel cache memory 50. While the present invention has been explained with reference to specific clock times which implies that the specific semiconductor devices used in the data arrays 53 are capable of responding to signals during the clock phase cycles, it will be understood that the access time of the novel cache memory is approaching the limits of the response time of the devices used in the memory.

What we claim is:

1. A high-speed partitioned set associative cache memory, comprising:
   high-speed cache memory data array means associated with a CPU,
   said cache memory data array means having a plurality of individual partial data array boards which together comprise said memory data array,
   a full tag array mounted on each of the individual data array boards and coupled to an individual partial data array,
   a plurality of memory address registers, at least one mounted on each partial data array board and associated with each individual partial data array and each individual tag array on each of the data array boards,
   said memory address registers being adapted to receive an address from said CPU and for simultaneously accessing said partial data arrays and said tag arrays on all of said data array boards,
   logic circuit and control means mounted on a separate board from said plurality of individual partial data array boards for monitoring output error signals from said data arrays and from said tag arrays resulting from accessing memory addresses, and
   means for subsequently identifying the exact data or tag array where an error has occurred.

2. A high-speed partitioned set associative cache memory as set forth in claim 1 wherein each individual partial data array board of said cache memory data array means comprises a plurality of modules, each said module comprising a plurality of memory chips, and
   a plurality of said address registers mounted on each partial data array board in close proximity to said modules of said memory chips.

3. A high-speed partitioned set associative cache memory as set forth in claim 2 wherein each full tag array on each partial data array board comprises the plurality of modules, and
   each of said tag array modules comprising a plurality of memory chips in close proximity to one of said address registers.

4. A high-speed partitioned set associative cache memory as set forth in claim 1 wherein said plurality of individual partial data array boards each contain a portion of a full word and each tag array on each of said individual partial data array boards each contains full tag addresses,
   said logic and control means being mounted on a separate board for monitoring error output signals from said individual data arrays, and
   said logic circuit and control means further comprising data parity error means for checking parity error output signals from each selected block of said individual partial data array boards.

5. A high-speed partitioned set associative cache memory as set forth in claim 4 wherein said logic circuit and control means further comprises error decode means coupled to the output of said tag array and to the output of said data parity error means for decoding tag array comparison errors.

6. A high-speed partitioned set associative cache memory as set forth in claim 5 wherein said logic circuit and control means further comprises error status logic means coupled to the output of said error decoding means.

7. A high-speed partitioned set associative cache memory as set forth in claim 6 wherein said logic circuit and control means further comprises degrade means coupled to the output of said error status logic means for degrading a portion of said cache memory where an error has been identified.

8. A high-speed partitioned set associative cache memory as set forth in claim 6 wherein said logic circuit and control means further comprises interrupt sequence control means coupled to the output of said error status logic and to said CPU for interrupting the normal sequence of operation of said CPU.

9. A high-speed partitioned set associative cache memory as set forth in claim 4 wherein said logic and control means further comprise latch means coupled to the output of said logic and control means for maintaining a detected error condition.

10. A high-speed partitioned set associative cache memory as set forth in claim 9 which further includes truth table logic means coupled to said latch means for determining the module within the tag array where an error has occurred.

11. A high-speed partitioned set asscciative cache memory as set forth in claim 1 wherein said logic circuit and control means further comprises a multi phase clock adapted to access said partial data array addresses in a phase 1 operation and to access said full tag array and to enable the proper data paths from said partial data arrays during a phase 3 operation to provide output data during a clock cycle time.

12. A high-speed partitioned set associative cache memory as set forth in claim 11 wherein said logic circuit and control means further comprises means for comparing the outputs of all of said plurality of individual partial data array boards and full tag array with each other and for determining which board of said plurality of individual partial data array boards contains an error.

13. A high-speed partitioned set associative cache memory as set forth in claim 12 which further includes tag match comparison means for determining which board of said plurality of individual partial data array boards contains a tag error.

14. A high-speed partitioned set associative cache memory as set forth in claim 13 which further includes means for determining the type of error detected in said tag array or said data array.

15. A high-speed partitioned set associative cache memory as set forth in claim 14 which further includes error status logic means for correcting the error detected in said partial data array or said full tag arrays.

16. A high-speed partitioned set associative cache memory, comprising:

high-speed cache memory data array means associated with a CPU, said cache memory data array means having a plurality of individual partial data array boards which together comprise said memory data array, a full tag array mounted on each of the individual data array boards and coupled to an individual partial data array, a plurality of memory address registers, at least one mounted on each partial data array board and associated with each individual partial data array and each individual tag array on each of the data array boards, said memory address registers being adapted to receive an address from said CPU and for simultaneously accessing said partial data arrays and said tag arrays on all of said data array boards, logic circuit and control means mounted on a separate board from said plurality of individual partial data array boards for monitoring output error signals from said data arrays and from said tag arrays resulting from accessing memory addresses, said logic circuit and control means having a multi phase clock adapted to access said partial data array addresses in one clock phase and to access said full tag array and to enable the proper data paths from said partial data arrays in a subsequent clock phase to provide output data during a clock cycle time, and means for subsequently identifying the exact data or tag array where an error has occurred.

17. A high-speed partitioned set associative cache memory as set forth in claim 16 wherein said one clock phase and said subsequent clock phase comprise phases of the same clock cycle.

* * * * *